United States Patent [19]
Gantley

[11] 4,140,260
[45] Feb. 20, 1979

[54] SYSTEM FOR SEPARATING A SEMICONDUCTOR WAFER WITH DISCRETE PELLETS

[75] Inventor: Francis C. Gantley, Fulton, N.Y.

[73] Assignee: General Electric Company, Auburn, N.Y.

[21] Appl. No.: 562,794

[22] Filed: Mar. 27, 1975

Related U.S. Application Data

[62] Division of Ser. No. 440,834, Feb. 8, 1974, Pat. No. 3,918,150.

[51] Int. Cl.² .............................................. B26F 3/00
[52] U.S. Cl. ........................................ 225/93; 225/103
[58] Field of Search ................. 225/2, 93, 96, 96.5, 225/103; 29/413, 583

[56] References Cited

U.S. PATENT DOCUMENTS

| | | | |
|---|---|---|---|
| 3,040,489 | 6/1962 | Costa | 29/413 X |
| 3,206,088 | 9/1965 | Meyer et al. | 225/103 X |
| 3,396,452 | 8/1968 | Sato et al. | 225/2 X |
| 3,461,537 | 8/1969 | Lotz | 29/413 |
| 3,497,948 | 3/1970 | Wiesler et al. | 29/583 |
| 3,537,169 | 11/1970 | Eigman | 225/2 X |
| 3,562,057 | 2/1971 | McAlister et al. | 225/93 X |
| 3,714,704 | 2/1973 | Moore | 29/583 X |
| 3,727,282 | 4/1973 | Neary | 225/96.5 X |
| 3,870,196 | 3/1975 | Hargraves | 225/103 X |

*Primary Examiner*—Othell M. Simpson
*Attorney, Agent, or Firm*—Robert J. Mooney; Stephen B. Salai

[57] ABSTRACT

This invention relates to a system for separating a semiconductor wafer into a plurality of discrete pellets while maintaining the relative orientation that the pellets exhibited when in the wafer. The invention is carried out by first applying a ductile variable coupling layer to a surface of the wafer. The coupling layer is affixed to a stretchable membrane which, after the wafer is subdivided, is stretched to space the pellets from one another. The coupling material adheres more tightly to the membrane than to the wafer. A portion of the bond between the ductile coupling layer and the membrane is broken during stretch so that the pellets adhere less tightly to the coupling layer following stretch than prior thereto.

3 Claims, 11 Drawing Figures

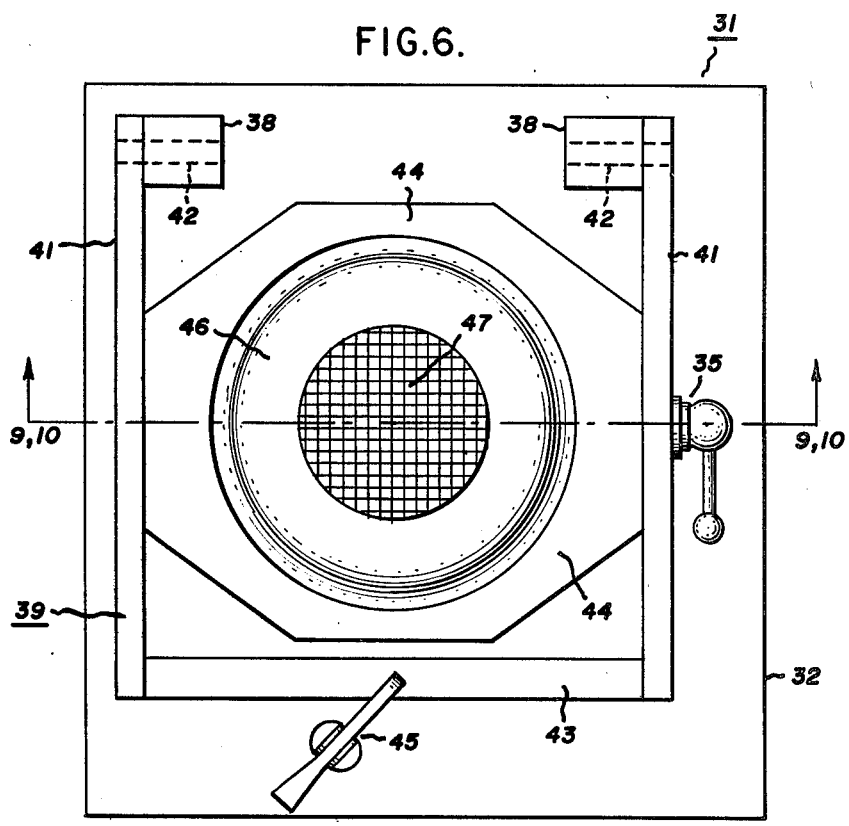
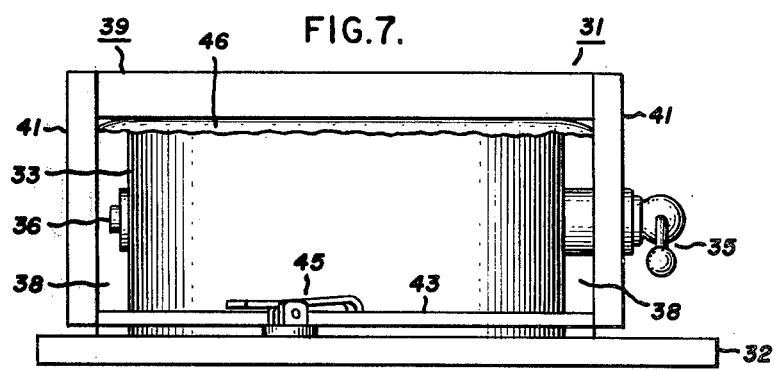
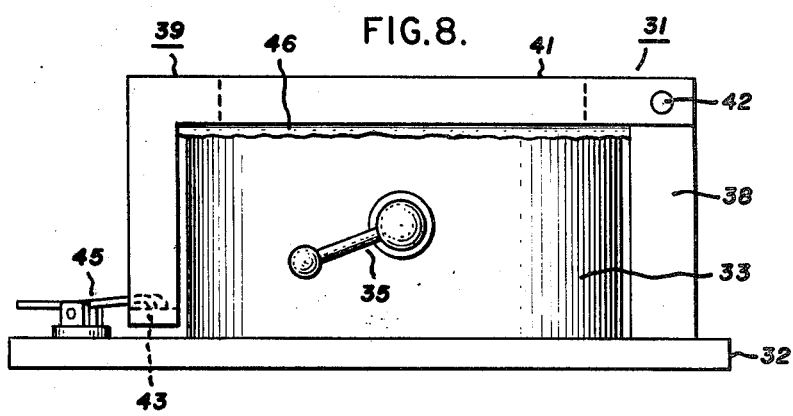

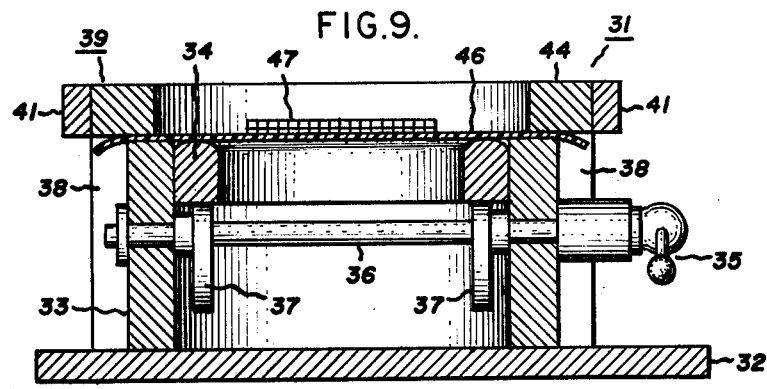
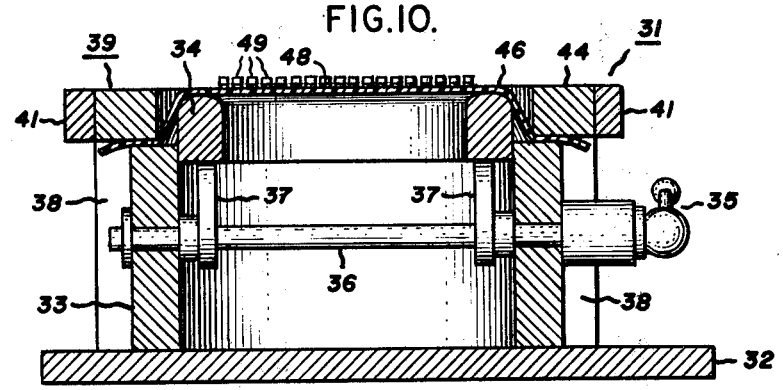
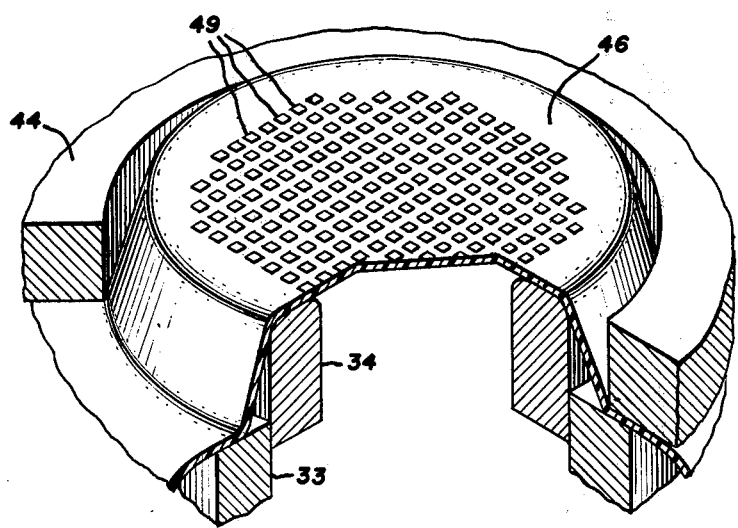

SYSTEM FOR SEPARATING A SEMICONDUCTOR WAFER WITH DISCRETE PELLETS

This is a continuation, division of application Ser. No. 440,834, filed Feb. 8, 1974, now Pat. No. 3,918,150 entitled, "System for separating a Semiconductor Wafer Into Discrete Pellets."

BACKGROUND OF THE INVENTION

This invention relates to a system for separating pellets formed by subdivision of a parent semiconductor wafer and, more particularly, to an improved pellet separation system employing a "stretchable membrane."

In the very competitive and cost conscious semiconductor industry there is a constant search for ways to improve the efficiency of manufacturing processes and thereby to reduce costs. For example, much attention is currently being given to efforts to fabircate semiconductor devices from ever larger wafers.

Utilization of a larger wafer makes problems that are encountered during wafer subdivision more significant. In general, the two major problems associated with wafer subdivision include the difficulty of supporting the wafer during subdivision and the difficulty of supporting and handling the discrete pellets formed by subdivision. Prior improvements in the subdivision process have generally tended to alleviate only one of the problems and have had little or no effect on the other. In certain instances proposed methods for solving one problem have even had deleterious effects with respect to the second problem. An example of a system with deleterious side effects is the scribing and subdividing method in which a wafer is affixed to a metal shim by an adhesive wax. The wafer is scribed and the shim is flexed causing wafer fracture and subdivision. The system proved to be an excellent way to support a wafer during the subdivision process. However, handling of the individual pellets provided was difficult inasmuch as the wax adhered tightly to the pellets and thus the pellets were difficult to remove from the shim. Furthermore, a residual layer of wax generally remained on the pellets following their removal from the shim. This residual layer frequently had deleterious effects with respect to remaining processing steps.

Consequently, it was desired to eliminate the utilization of a layer of wax on the wafer. As a result, a method of "shimless scribing" was developed. This method of shimless scribing is fully described in U.S. Pat. No. 3,559,855, which is assigned to the assignee of the present application. Shimless scribing provides an excellent method for subdividing semiconductor wafers without requiring waxes or other potential contaminants. However, it is still difficult to handle the individual pellets following shimless scribing.

Another approach, taken by others, concentrated on alleviating handling problems following subdivision. In this method, a subdivided wafer is placed on a membrane which is then stretched in all directions to separate the pellets but maintain them in the same relative orientation. This stretchable membrane method is fully described in U.S. Pat. No. 3,448,510 (Bippus). A problem that has been found when utilizing the technique of Bippus is that the subdivision process itself is still very difficult and awkward. For Example, FIGS. 10A thru 10R of Bippus illustrate the process of subdividing a semiconductor wafer into pellets and separating the pellets for final delivery to an assembly area. Eighteen separate Figures are required to show the process. Only the last four Figures relate to the membrane stretch and subsequent steps. The first fourteen Figures illustrate the subdivision of the wafer. Consequently, it will be appreciated that while Bippus has taught an effective way of separating the pellets in a subdivided wafer once the fractured wafer has been placed on a stretchable membrane, realization of the full potential of his system will only be had when the subdivision process itself can be carried out more easily than as taught by him.

It is an object of this invention, therefore, to provide a system for subdividing semiconductor wafers into pellets that complements the stretchable membrane handling techniques thus permitting the realization of the full potential of the stretchable membrane system.

SUMMARY OF THE INVENTION

This invention is characterized by a method of manufacturing semiconductor devices including the step of providing a semiconductor wafer that has been diffused so as to form, upon subdivision, a plurality of semiconductor device pellets. In accordance with the subject invention, a layer of ductile variable coupling material is adhered to one major surface of the semiconductor wafer. A stretchable membrane is then affixed to the ductile material. The ductile material is selected so that it adheres more tightly to the membrane than to the wafer. Next, the wafer is subdivided to form a plurality of semiconductor pellets and the membrane is stretched in all directions so as to spatially separate the several pellets while maintaining them in their original relative orientation. Finally the pellets are individually removed from the coupling material to be conventionally utilized in further semiconductor device fabrication.

A feature of the subject method is that the coupling strength between the pellets and the stretchable membrane decreases during the stretch operation. Inasmuch as the ductile material adheres more tightly to the membrane than to the pellets, the adhesion between the pellets and the ductile material is broken in portions of the interface therebetween near the periphery of the pellets. This will be more fully described below. As a result of this reduced adhering area, the pellets are easily removable from the ductile material. In addition, it will be appreciated that inasmuch as the ductile material adheres more tightly to the membrane than to the pellets, no residual ductile material remains on the pellets as they are removed therefrom. Following stretch, the adhesion of the pellets to the ductile material is low enough that they can easily be removed by conventional systems such as vacuum pickup chucks.

Yet another feature of the subject invention is that the ductile material can be applied as a liquid and then cured. For example, techniques such as centrifuging can be employed to uniformly distribute the liquid over the surface of the wafer. An important advantage derived from the utilization of the liquid application of the ductile material results from the ability of the liquid to conform to irregularities in the surface of the wafer. Consequently, the subject method is effective when utilized with wafers having rough surfaces. Prior art methods such as that disclosed by Bippus have been found ineffectual when utilized on relatively rough wafer surfaces.

DESCRIPTION OF THE DRAWINGS

These and other features and objects of the present invention will become more apparent upon a perusal of the following description taken in conjunction with the accompanying drawings wherein:

FIG. 6 is a plan view of a suitable apparatus for performing the stretching operation;

FIGS. 7 and 8 are front and side elevation views, respectively, of the apparatus depicted in FIG. 6;

FIGS. 9 and 10 are sectional elevation views of the apparatus depicted in FIGS. 6–8 during the stretching operation; and FIG. 11 is a diagramatic perspective view of the stretched wafer with pellets mounted thereon.

DESCRIPTION OF THE PREFERRED EMBODIMENT

Figure 1:
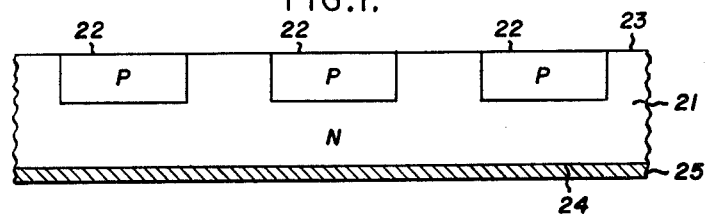
FIG. 1 is an elevation view of a portion of a semiconductor wafer that is diffused so as to form, upon subdivision, a plurality of semiconductor device pellets.

Referring first to FIG. 1 there is shown a body of semiconductor material 21 such as a portion of a wafer of monocrystalline silicon that defines two major surfaces 23 and 24. It is, of course, understood that the body 21 can be composed of other semiconductor materials such as germanium or gallium arsenide. By way of example, the body 21 is of N type conductivity and has been diffused with a plurality of regions 22 of P type conductivity. Thus, if the body 21 is separated along lines passing between the P type regions 22, a plurality of P-N semiconductor diode pellets will be formed. A metallic contact 25 covers the major surface 24. It should be appreciated, however, that the contact 25 is shown for purposes of illustration only and the presence or absence of a contact on the wafer has no effect on the subject invention. Furthermore, it should be realized that the wafer can be diffused to form devices other than diodes, such as, for example, transistors, SCR's, integrated circuits and the like.

Figure 2:
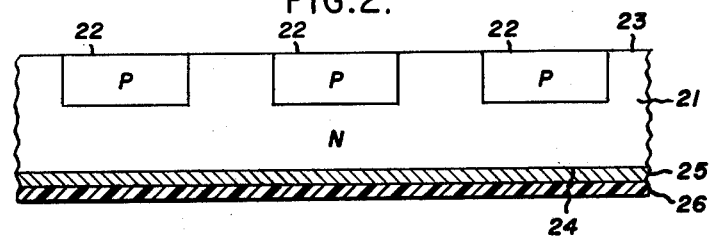
FIG. 2 shows the wafer depicted in FIG. 1 after a layer of variable coupling material has been affixed thereto.

Referring now to FIG. 2 there is shown the wafer 21 that was depicted in FIG. 1. A layer of ductile variable coupling material 26 has been affixed to the metal contact layer 25. Inasmuch as the presence of the metallic layer does not affect the process, the ductile coating 26 can be referred to as adhered to the major surface 24.

The ductile coating is preferably a material such as a synthetic resin having proper stretchability and the other properties necessary to function as hereinafter set forth. Typical examples of suitable resins include Coverlac SC-267, coverlac SC-250L, Coverlac SC-249, Coverlac SC-3808 and Coverlac SC-515, all available from Spraylat Corporation, Mount Vernon, N.Y. Another suitable coating is Scotch Clad Strip Coating 2253, which is commercially available from the 3M Company, St. Paul, Minn. Except for Coverlac SC-515, which is soluble in water, all of the above mentioned coatings are soluble in solvents such as MEK and acetone. Coverlac SC-267 and Scotch Clad Strip Coating 2253 have almost identical characteristics and are preferred because they are easily and quickly soluble in either MEK or acetone, they leave no residue on the semiconductor material or metallic contacts when removed and they are more stretchable than the other named coatings.

In order to assure that the coating adheres well to the metal contact 25 or the surface 24 as the case may be, the coating 26 is preferably applied in a liquid state and cured after application. Any conventional method can be used to apply the coating 26. For example, the coating can be painted, sprayed or dropped on. It is preferable to centrifuge the coating to insure a uniform coat. Cure for the aforementioned coatings can be carried out at room temperature for 45 minutes or at 100° F. for 30 minutes. The coating should preferably be from 0.1 to 0.5 mils in thickness.

Figure 3:
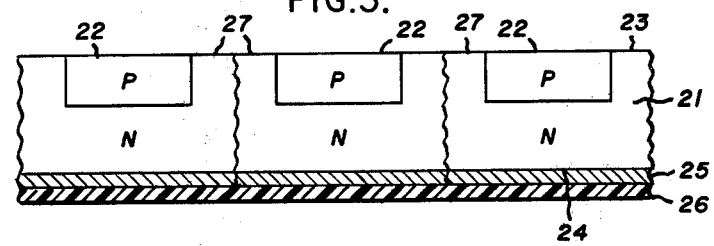
FIG. 3 illustrates the combination depicted in FIG. 2 following subdivision of the wafer into a plurality of pellets.

Next the wafer 21 is divided into a plurality of diode pellets 27 as shown in FIG. 3. The wafer 21 is first scribed by a conventional system and then divided by techniques such as those taught in the aforementioned shimless scribing patent. It will be noted that during the subdivision step the ductile layer 26 remains intact and thus holds the several pellets 27 together following subdivision.

Figure 4:
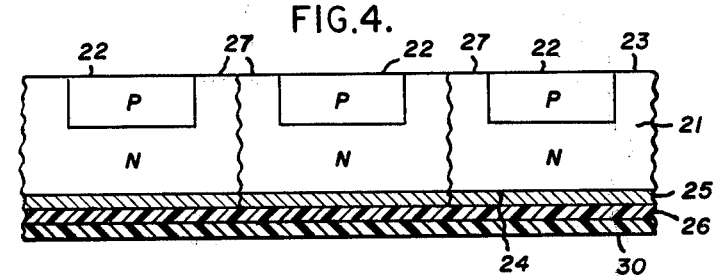
FIG. 4 depicts the subdivided wafer with a deformable membrane adhered to the layer of variable coupling material.

Referring now to FIG. 4, the next step in the process is illustrated. A stretchable membrane 30 is affixed to the layer of ductile coupling material 26. The membrane 30 is selected so that the adhesion between the membrane and the layer 26 is stronger than the adhesion between the coupling layer and the wafer 21 or the metallic contact layer 25. In order to assure that the adhesion between the coupling layer 26 and the membrane 30 is stronger, the interface can be heat sealed at a temperature of approximately 225° F. if desired. Another system of insuring that the membrane-coating bond is the stronger bond is to include an adhesive layer between the membrane and the coating as by forming the membrane with a pressure sensitive tape.

Figure 5:
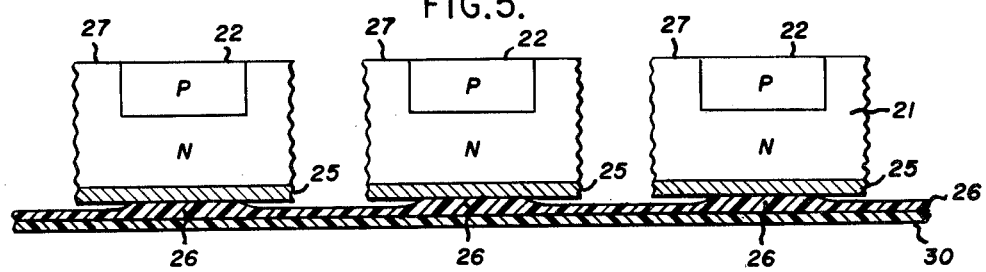
FIG. 5 depicts the combination shown in FIG. 4 following the stretching of the membrane as hereinafter set forth.

Referring now to FIG. 5, there is shown the combination depicted in FIG. 4 after the stretchable membrane 30 has been stretched in all directions. The stretching can be, for example, accomplished by employing the apparatus to be described below. It will be appreciated that the most noticeable effect of the stretching is to separate the individual pellets 27. However, it will also be noted that portions of the adhesion between the variable coupling layer 26 and the major surface 24 are broken. The adhesion breakdown occurs first around the periphery of the pellets and moves inwardly, effectively adhering each pellet to a pedestal. Consequently, part of the significance of the "variable" coupling layer 26 becomes evident. During the scribing and breaking operation, the entire lower surface of each pellet 27 is affixed to the coupling layer 26. Thus, the pellets are firmly supported. However, following stretch, only a small portion of the pellet surface 24 is affixed to the layer 26 and thus the pellets 27 can more easily be removed. Consequently, the coupling strength between the pellets 27 and the membrane 30 "varies" during stretch. Individual removal of the pellets, by utilization of such apparatus as a conventional vacuum probe follows.

A further advantage of the utilization of the variable coupling layer 26 set forth above is that the method operates well without regard to the surface roughness of the major surface 24. The technique described by Bippus in the aforementioned patent has been found effective only for relatively smooth surface pellets.

It should be appreciated that while as described above the subdivision step occurred prior to the time that the membrane was affixed to the coating layer, such an order of steps is not necessary. Several timing options for subdivision are possible. For example, the membrane can be affixed to the coating layer and then the pellet can be scribed and subdivided. Or the pellet can be scribed prior to affixing the membrane to the coating and subdivided following the affixing step.

Referring now to FIGS. 6-9 there is shown a membrane stretch apparatus 31 suitable for performing the stretching operation. A base 32 supports an outer cylinder 33 that slideably retains an annular inner member 34 with a rounded upper surface. A handle 35 projects from the side of the cylinder 33 and is coupled to a shaft 36 that is rotatably mounted in the cylinder.

Two eccentric cams 37 are mounted on a shaft 36 and support the inner annular member 34. It will be appreciated that when the handle 35 is rotated the cams will drive the annular member 34 upward from the position shown in the sectional FIG. 9.

Two pillars 38 extending from the rear of the base 32 support a hinged clamp mechanism 39. Two L-shaped clamp members 41 are affixed to the pillars 38 by hinge pins 42 and are coupled together by a horizontal bar 43. Spanning between the L-shaped members 41 is a clamp member 44 with a circular opening therein. Observation of FIG. 9 shows that the clamp member 44 can be positioned tightly against the top of the cylinder 33. The circular opening is slightly larger than the inside diameter of the cylinder 33.

Affixed near the front of the base 32 is a releasable clamp 45 that, when actuated, forces the horizontal bar 43 in a downward direction thus tightly urging the clamp member 44 against the upper surface of the cylinder 33.

During operation, the releasable clamp 45 is released and the L-shaped members are hinged to separate the clamp member 44 and the cylinder 33. A stretchable membrane 46 with a subdivided wafer 47 adhered thereto by a layer of ductile coating material 48 (as described with respect to FIGS. 1-5) is placed on the upper surface of the cylindrical membrane 33. The clamp member is then positioned as shown in FIGS. 6-9 and the clamp 45 is tightened to clamp the stretchable membrane 46 to the upper surface of the cylindrical member 33. Next, the handle 35 is rotated to the position shown in FIG. 10 thus driving the annular member 34 in an upward direction and stretching the membrane in all directions such that the pellets of the wafer 47 are spatially separated. The pellets 49 are then supported on the small pedestals of coating material as illustrated in FIG. 5 and can easily be individually removed by such conventional apparatus as vacuum pickup probes. FIG. 11 is a perspective view of the pellets 49 as they appear at this time.

In light of the foregoing, many modifications and variations of the present invention will be apparent to those skilled in the art. Consequently, it will be appreciated that the true scope of the invention is as defined by the following claims.

What is claimed is:

1. Apparatus for manufacturing semiconductor devices, said apparatus comprising, in combination:
   a wafer of semiconductor material defining two major surfaces and comprising a plurality of semiconductor pellets;
   a sheet of stretchable membrane having a larger area than said wafer; and
   a layer of ductile variable coupling material for coupling one major surface of said wafer to said membrane, said coupling material being synthetic resin and being selected to adhere more tightly to said membrane than to said wafer.

2. Apparatus according to claim 1 wherein said layer of ductile variable coupling material is of a thickness in the range of about 0.1 to about 0.5 mils.

3. Apparatus according to claim 2 wherein said semiconductor wafer is scribed.

* * * * *

UNITED STATES PATENT AND TRADEMARK OFFICE
CERTIFICATE OF CORRECTION

PATENT NO. : 4,140,260
DATED : Feb. 20, 1979
INVENTOR(S) : Francis C. Gantley

It is certified that error appears in the above-identified patent and that said Letters Patent are hereby corrected as shown below:

In the title: Delete "WITH" and insert -- INTO --.

In the written description:
Col. 1, line 5, delete "continuation".

Signed and Sealed this

Fifth Day of June 1979

[SEAL]

Attest:

RUTH C. MASON
Attesting Officer

DONALD W. BANNER
Commissioner of Patents and Trademarks